US010985089B2

(12) United States Patent
Hart et al.

(10) Patent No.: US 10,985,089 B2
(45) Date of Patent: Apr. 20, 2021

(54) SEMICONDUCTOR COOLING ARRANGEMENT

(71) Applicant: YASA LIMITED, Kidlington (GB)

(72) Inventors: Simon David Hart, Powys (GB); Tim Woolmer, Waterperry (GB); Christopher Stuart Malam, Powys (GB); Graham Law, Powys (GB); Francesca Bernardine Bumpus, Shrewsbury (GB)

(73) Assignee: YASA LIMITED, Kidlington (GB)

( * ) Notice: Subject to any disclaimer, the term of this patent is extended or adjusted under 35 U.S.C. 154(b) by 0 days.

(21) Appl. No.: 16/482,147

(22) PCT Filed: Jan. 30, 2018

(86) PCT No.: PCT/GB2018/050260
§ 371 (c)(1),
(2) Date: Jul. 30, 2019

(87) PCT Pub. No.: WO2018/138532
PCT Pub. Date: Aug. 2, 2018

(65) Prior Publication Data
US 2020/0006197 A1    Jan. 2, 2020

(30) Foreign Application Priority Data
Jan. 30, 2017    (GB) .................................. 1701486

(51) Int. Cl.
*H01L 23/473*    (2006.01)
*H01L 23/14*    (2006.01)
(Continued)

(52) U.S. Cl.
CPC ............ *H01L 23/473* (2013.01); *H01L 23/14* (2013.01); *H01L 23/36* (2013.01); *H01L 23/40* (2013.01)

(58) Field of Classification Search
CPC ...................................................... H01L 23/473
See application file for complete search history.

(56) References Cited

U.S. PATENT DOCUMENTS 4,010,489 A * 3/1977 Bourbeau ........... H01L 23/4012
257/714
4,399,484 A * 8/1983 Mayer ................ H05K 7/20345
165/908
(Continued)

FOREIGN PATENT DOCUMENTS

EP    2043412 A1    4/2009
GB    2403354 A    12/2004
(Continued)

OTHER PUBLICATIONS

Examination Report under Section 18(3) conducted in GB1701486. 1, dated Jul. 18, 2019.
(Continued)

*Primary Examiner* — Mukundbhai G Patel
(74) *Attorney, Agent, or Firm* — Meunier Carlin & Curfman LLC

(57) ABSTRACT

The present invention relates to a semiconductor cooling arrangement for cooling semiconductor devices, such as power semiconductors. The semiconductor cooling arrangement comprises one or more semiconductor assemblies located in a chamber within a housing. The housing comprises inlet and outlet ports for receiving and outputting a cooling medium. The chamber is flooded with a cooling medium to cool the assemblies. The assemblies themselves each comprise a heatsink and one or more semiconductor power devices thermally coupled to the heatsink. The heatsink comprises heat exchanging elements in the form of a plurality of holes in the heatsink extending through the heatsink from one surface to another surface such that the
(Continued)

cooling medium flows through the holes to extract heat from the heatsink.

33 Claims, 14 Drawing Sheets

(51) Int. Cl.
*H01L 23/36* (2006.01)
*H01L 23/40* (2006.01)

(56) References Cited

U.S. PATENT DOCUMENTS

| | | | |
|---|---|---|---|
| 5,003,376 A | 3/1991 | Iversen | |
| 5,099,884 A * | 3/1992 | Monahan | F01L 1/46 123/90.11 |
| 5,380,956 A * | 1/1995 | Loo | H01L 23/473 174/252 |
| 5,841,634 A * | 11/1998 | Visser | F28F 3/12 361/699 |
| 6,278,179 B1 | 8/2001 | Mermet-Guyennet | |
| 6,501,172 B1 | 12/2002 | Fukada et al. | |
| 6,977,346 B2 * | 12/2005 | Jairazbhoy | H01L 23/3677 174/252 |
| 7,812,443 B2 * | 10/2010 | Tokuyama | H05K 7/20927 257/706 |
| 7,957,145 B2 * | 6/2011 | Suzuki | H05K 7/20936 361/701 |
| 8,659,896 B2 * | 2/2014 | Dede | H01L 23/4735 361/699 |
| 2006/0096299 A1 | 5/2006 | Mamitsu et al. | |
| 2009/0161301 A1 | 6/2009 | Woody et al. | |
| 2010/0038774 A1 * | 2/2010 | Zhang | H01L 23/473 257/714 |
| 2010/0302733 A1 | 12/2010 | Woody et al. | |
| 2011/0103019 A1 | 5/2011 | Campbell | |
| 2011/0141690 A1 | 6/2011 | Le et al. | |
| 2011/0242760 A1 | 10/2011 | Bolt Setefan et al. | |
| 2014/0204532 A1 | 7/2014 | Mehring | |
| 2014/0355212 A1 | 12/2014 | Campbell et al. | |
| 2017/0265328 A1 * | 9/2017 | Sasaki | H05K 7/20781 |

FOREIGN PATENT DOCUMENTS

| | | |
|---|---|---|
| JP | 2012016095 A | 1/2012 |
| JP | 2016158358 A | 9/2016 |
| WO | 2005048672 A1 | 5/2005 |
| WO | 2010092400 A2 | 8/2010 |
| WO | 2016008509 A1 | 1/2016 |
| WO | 2018138530 A1 | 8/2018 |

OTHER PUBLICATIONS

International Search Report and Written Opinion, issued by the International Searching Authority (EPO) in Application No. PCT/GB2018/050258 dated Apr. 16, 2018, 13 pages.

Combined Search and Examination Report issued by the Intellectual Property Office (GB) in Application No. GB1701487.9 dated Jun. 30, 2017, 7 pages.

Examination Report under Section 18(3) in GB1701487.9, dated Aug. 2, 2019.

International Search Report and Written Opinion, issued by the International Searching Authority (EPO) in Application No. PCT/GB2018/050260 dated Apr. 16, 2018, 12 pages.

Combined Search and Examination Report issued by the Intellectual Property Office (GB) in Application No. GB1701486.1 dated Jun. 13, 2017, 6 pages.

* cited by examiner

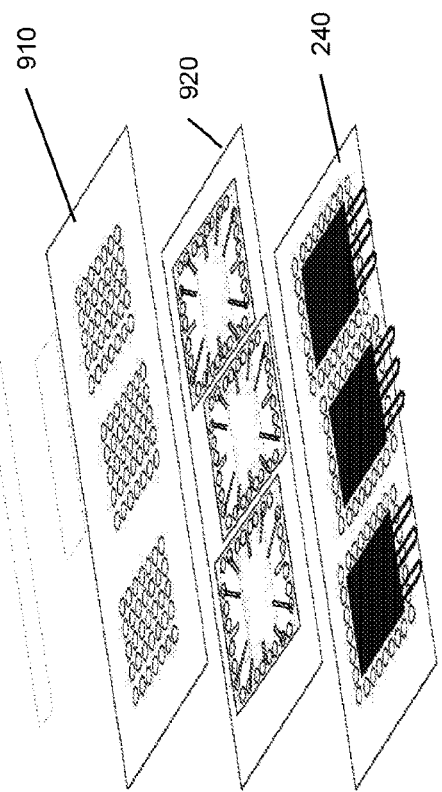
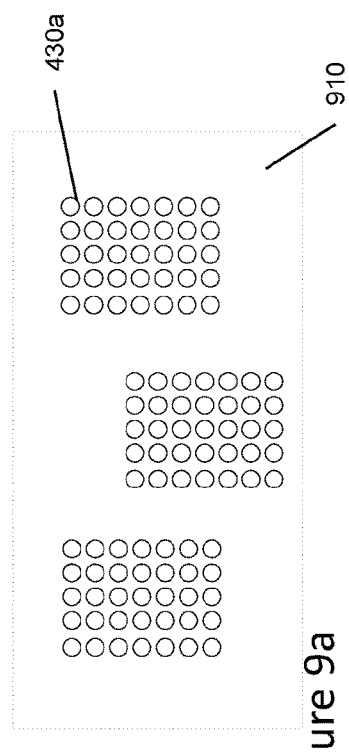
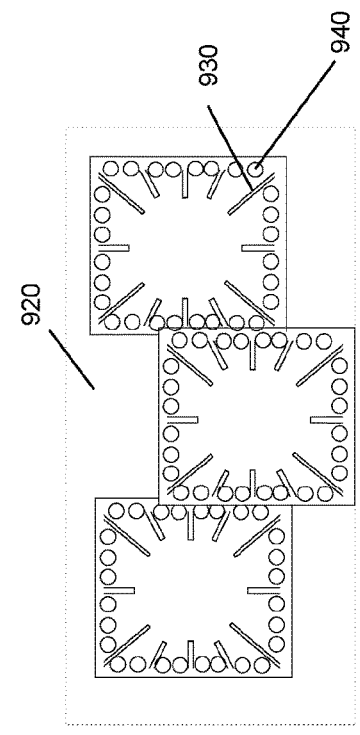
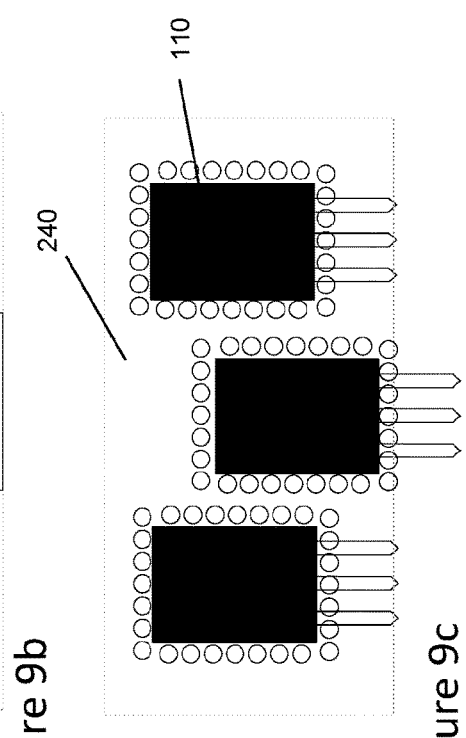
Figure 9d
Figure 9e
Figure 9a
Figure 9b
Figure 9c ns is usually a combined ceramic layer and copper layer, one at least of which has a plurality of protrusions on its surface, opposite to the surface on which are mounted the components to be cooled, said protrusions acting as mini heat-sinks within the coolant cavity.

SEMICONDUCTOR COOLING ARRANGEMENT

FIELD OF THE INVENTION

The present invention relates to a semiconductor cooling arrangement for cooling semiconductor devices, such as power semiconductors. Such arrangements are advantageous in the field of inverters due to the high power losses and associated heat generated by such devices.

BACKGROUND OF THE INVENTION

Electrical and electronic components generate heat as a by-product when they are in use. Overheating usually impacts performance and component lifetime and therefore electrical and particularly electronic components are typically cooled to prevent overheating.

Devices have limitations on the upper temperature at which they may be effectively operated and as limit temperatures are breached so devices may become less efficient and may fail. In most instances devices are unable to recover from failures due to overheating and the whole system in which they are a part becomes unusable, requiring repair or in many cases "burnt out" modules/systems are replaced.

Prevention being better than cure much effort has gone to making systems more robust, but ease of repair is also of value.

Many different approaches have been used to address overheating limitations: Some have sought to increase the operating limit of devices, though the scope for this is limited, whilst the majority of effort has been focussed on removal of heat from devices, sub-modules and systems. In many power electronics applications, heat sinks are used where efficient heat dissipation is required. Heat sinks absorb and dissipate heat from electrical components by thermal contact. For example, a heat sink may be soldered, bonded or otherwise mounted to a power electronic device to improve heat removal by providing a large thermal capacity into which waste heat can flow.

In high power applications the heat sink may be enlarged to improve thermal capacity. However increasing the size of a heat sink increases the weight and volume of a power supply module and correspondingly the cost. In many instances the available space for such modules particularly for automotive applications is decreasing rather than the reverse.

Considerable effort has been applied to cooling of electronic components in computing systems wherein central processing units (CPUs) have many millions of semiconducting devices integrated onto the surface of a silicon die. Though heat loss from any one device is small, integration density has led to total heat dissipation being high and is a severe limitation on speed and lifetime of CPUs.

Some of the technologies for cooling electronic components in computing systems have also been applied in cooling of high power single or low level integration semiconducting switch devices.

In US2011/103019 there is described a liquid tight enclosure providing immersion cooling of an electronic system in which a cold plate is proposed having a liquid conduit for supplying coolant to the cold plate, said cold plate having a bottom surface coupled to an electronic component of the electric system and at least one open port on the side walls. In a particular embodiment coolant supplied by a conduit enters the top of the cooling plate and is partially allowed to exit through side ports, whilst remaining coolant is caused to flow through jets directed onto high heat flux components: Side port apertures and jet orifices being dimensioned to provide optimised cooling of components.

US2011/103019 is particularly directed towards cooling of CPUs in computers and describes cooling of a high powered processor chip mounted on a substrate said substrate being electrically and mechanically attached to a processor module which is further attached to a printed circuit board.

A disadvantage of US2011/103019 is poor heat spreading through said substrate and particularly poor heat spreading through connections to said printed circuit board.

For medium power converter modules there is another order of power dissipation to contend with, currents of 100's of amps and voltages of the order of 1000V in play. For medium power converters semiconducting switch devices are used and US2011/0242760 teaches an arrangement wherein semiconducting switch devices are mounted on laminated busbars so as to maintain electrical isolation between phases.

Prior to US2011/0242760 said lamination in busbars would have been a temperature limiting feature, whereas US2011/0242760 teaches applying a liquid cooled heatsink to the said laminated busbars wherein the heatsink is electrically isolated from the busbar. Removal of heat from busbars and by thermal conduction from electrically isolated switch devices mounted thereon improves overall power capacity, before temperature rise and thermal limitation of insulation layers is again a limiting factor.

US2014204532 provides an alternate mode of cooling of heat dissipating semiconducting devices using impingement jets wherein application of jet cooling (air, or liquid in an air matrix) is controlled locally by thermally deformable nozzles made from shape memory alloy which is thermally connected to semiconducting devices to be cooled. In this way devices may be cooled when required. However US2014204532 is directed towards chip level cooling with impingement jets focussed on backside of flip-chips. Teaching of US2014204532 is to liquid-in-air jets and is thereby limited in its cooling capacity and because cooling is at chip scale, pinout configurations further limit the connectivity of such cooling arrangements.

US2011141690 speaks to the use of a high thermally conductive printed circuit board substrate on one side of which is configured into the surface, features to promote turbulence in an impinging coolant flow whilst the other side of the circuit is configured to have electrical circuitry onto which are mounted power electronic components, for instance components of a power inverter module for use in a vehicle. The electrical circuitry side is electrically isolated from the side configured to promote turbulence.

Substrates such as direct bonded copper or direct bonded aluminium are suggested which comprise a ceramic (usually alumina) sandwich with copper or aluminium outer layers. However though these direct bonded substrates are good thermal conductors they are also expensive to manufacture and difficult to handle and carry out repairs.

Other approaches for improved cooling of power semiconducting devices include direct immersion of components in dielectric fluids and configuring of components to form coolant channels, use of phase change liquid/gas coolant systems to increase coolant effect.

In combination with these approaches particularly for power electronic systems has been optimisation of switching speed of power semiconducting switch devices: Reasoning for this is as follows—the faster the switch speed the less time the switch device spends in resistive mode and hence less joule heating losses in the device—however fast switching speeds increase inductive losses which may also lead to voltage spikes, hence a need for large low inductance busbars and symmetric phase legs in inverter modules and costly overvoltage specified capacitors.

A compromise is reached which inevitably leads to joule heating losses in semiconducting device switches. Despite best attempts all cooling approaches to date have been deficient in their cooling abilities and cooling efficiency of power semiconductor components has been a limiting feature of maximum power handling and power density for power semiconducting switch devices and hence power inverters.

The present invention seeks to increase the power density and maximum power handling of power inverters and semiconducting switch devices respectively, by significantly improving removal of waste heat and at the same time further reducing system wide inductance and corresponding joule heating losses in semiconducting switch devices.

We have therefore appreciated the need for an improved cooling arrangement.

SUMMARY OF THE INVENTION

The present invention therefore provides a semiconductor cooling arrangement, comprising: one or more semiconductor assemblies, each assembly comprising a heatsink and one or more semiconductor power devices thermally coupled to the heatsink; a housing for housing the one or more assemblies in a chamber within the housing, the housing comprising inlet and outlet ports in fluid communication with the chamber respectively for receiving and outputting a cooling fluid, the chamber being flooded with a cooling fluid to cool the assemblies; wherein the heatsink comprises heat exchanging elements in the form of a plurality of holes in the heatsink extending through the heatsink from a front face of the heatsink, onto which the one or more semiconductor power devices are coupled, to a rear face of the heatsink opposing the front face, such that the cooling fluid flows through the holes to extract heat from the heatsink. The heatsink may have a flat form, although this may instead be shaped, or have features protruding from its surface, such as fins or other arrangements to aid the cooling.

Advantageously, the combination of the heatsink being submerged in the cooling fluid, and the presence of the holes, through which the cooling fluid flows, provides a cooling arrangement having superior cooling properties, which is well suited for applications such as inverters.

The holes may be located in the heatsink in the form of a single row of holes surrounding the periphery of each of the one or more semiconductor power devices coupled to the heatsink. Where there are two or more semiconductor power devices, there may be areas in the heatsink between the single row of holes surrounding the periphery of neighbouring semiconductor power devices that are devoid of holes. With this design, there is a balance to be made between the heatsink's ability to extract heat from the power devices, and the number of holes used to transfer that heat into the cooling fluid. Too many or too few holes will result in a heatsink that has a cooling performance that is sub-optimal.

The semiconductor power devices may be electrically coupled to the heatsink. In this configuration, and the heatsink is configured as a bus bar to electrically connect the one or more semiconductor power devices together to transmit power between the one or more semiconductor power devices. This enables the design to be compact, since the heatsink also enables the power devices to be coupled electrically with one another. This also advantageously reduces inductive pathways between the components, again improving the electrical performance of the assemblies mounted on the heatsink busbar.

The one or more semiconductor power devices may comprise an IGBT, Silicon carbide (SiC) semiconducting switch devices, metal oxide semiconducting field effect transistors (MOSFETs), or power diodes.

The one or more semiconductor power devices may be mechanically connected to or are bonded to the heatsink.

One or more of the semiconductor assemblies may be mounted to a Printed Circuit Board (PCB), the PCB providing electrical connections between the one or more semiconductor power devices. The PCB and additional lower power electrical and electronic components mounted on the PCB may also be located within the chamber and immersed in the cooling fluid.

With this arrangement of the PCB, the one or more semiconductor devices may be co-located within the chamber, and the lower power electrical and electronic components are co-located within a different area of the chamber to the one or more semiconductor power devices. Such an arrangement means that higher power devices are grouped with other high power devices, and lower power devices are group with other lower power devices, which enables better management of the cooling.

The inlet port in fluid communication with the chamber may be configured to flow cooling fluid more favourably in the areas of the chamber occupied by the semiconductor devices. 51% to 99% of the cooling fluid flow may be caused to flow in the areas of the chamber occupied by the semiconductor devices. Preferably 95% of the cooling fluid flows in the area occupied by the one or more semiconductor power devices, which are power devices that create the greatest amount of heat within the chamber. This arrangement advantageously targets the "hot spots" to supply the cooling fluid to those areas that need it most.

When there are two or more semiconductor assemblies located within the chamber, each assembly may be arranged such that the cooling fluid flows through the holes in one of the heatsinks and impinges on the surface of the next heatsink in the flow path of the cooling fluid. Causing the outflow of cooling fluid from one heatsink to impinge on the surface of the next heatsink greatly improves the cooling arrangement, since the cooling fluid is forced to meander through the chamber and contact as much surface of the heatsinks as possible before flowing through the holes of the heatsinks and removing further heat.

The two or more semiconductor assemblies may be arranged to be offset from one another such that the holes of one heatsink are out of alignment with the holes in the next heatsink. Again, this encourages the cooling fluid to meander through the chamber, contacting as much surface area of the heatsinks within the chamber, instead of flowing straight through the holes of each of the assemblies.

The two or more semiconductor assemblies may be arranged parallel to one another. They may instead be arranged at angles from one another in some embodiments.

One or more heatsinks may comprise a cooling fluid distributor for distributing the cooling fluid. Such a cooling fluid distributor may increase the cooling efficiency of the heatsink. This cooling fluid distributor may comprises first and second layers of a distributor attached to the rear face of the heatsink, where the rear face of the heatsink is the face of the heatsink opposing the face having the semiconductor power devices coupled thereto. The first layer may comprise an outer layer and having a plurality of holes extending between front and rear faces of the first layer, the holes being located on an area of the heatsink associated with the positions of the one or more semiconductor power devices. The second layer, sandwiched between the heatsink and the first layer, may comprise a row of holes located in a position equivalent to a periphery of each of the semiconductor power devices coupled to the heatsink, and a plurality of guides extending inward of the position of the holes in the second layer to guide cooling fluid between the holes in the first layer and the holes in the second layer.

The semiconductor cooling arrangement may comprise one or more baffle plates arranged within the housing in the flow path of the cooling fluid between the inlet and the outlet, the one or more baffle plates comprising a plurality of holes in the baffle plate extending through the baffle plate between a front face and a rear face, such that the cooling fluid flows through the holes. Such an arrangement advantageously set up impinging jets of cooling fluid, which may impinge on components or the heatsinks. The baffle plates may also provide turbulent flow of the cooling fluid.

Each of the one or more baffle plates may be arranged within the housing to be adjacent to a respective one of each of the one or more semiconductor assemblies and located in the flow path between the inlet and the respective semiconductor assembly.

Each of the one or more baffle plates may be arranged within the housing to be within 1 mm to 5 mm, preferably 2 mm, of a respective one of each of the one or more semiconductor assemblies. Such close proximity of the baffle plate enables impinging jets of cooling fluid and/or turbulent flow of the cooling fluid to impinge on the heatsink and thus remove heat from the heatsink more efficiently.

The plurality of holes of the baffle may comprise one or more groupings of a plurality of holes in each baffle plate, each grouping of a plurality of holes being associated with a respective one of each of the one or more semiconductor power devices thermally coupled to the heatsink, and each of the grouping of the plurality of holes inn the baffle plate are arranged to be in the flow path of the cooling fluid between the inlet and the respective one of each of the one or more semiconductor power devices.

Each of the one or more groupings of a plurality of holes may comprise an array of a plurality of holes. Each array of a plurality of holes may be dimensioned to be of a similar width and height of the area of the heatsink covered by the respective one or more semiconductor power devices on the heatsink.

The holes may be shaped to provide a turbulent flow of the cooling fluid.

The holes of the heatsink, and/or of the baffle (where one is present) may have a circular, rectangular, rounded rectangular or a star shape. Furthermore, the diameter of the holes increases between the front face and the rear face. This gives the holes a countersunk appearance when viewed from the rear face, and advantageously provides a hole profile that has a reduced effect on the flow rate of the cooling fluid compared to holes having straight sided profiles.

The cooling fluid may be a dielectric cooling fluid. It may be pumped so as to cause the fluid to flow between the inlet port and the outlet port. The inlet port and outlet port may be coupled to a cooling circuit comprising a heat exchanger, the heat exchanger for removing heat from the cooling fluid.

The one or more semiconductor assemblies may be configured to form an inverter for converting between DC and AC.

When the inverter is configured to convert DC to AC, the inverter may comprise one or more electrical inputs for receiving one or more DC voltages, and one or more electrical outputs for outputting one or more AC voltages. The output of the inverter may power an electric motor.

When the inverter is configured to convert AC to DC, the inverter may comprise one or more electrical inputs for receiving one or more AC voltages, and one or more electrical outputs for outputting one or more DC voltages. The output of the inverter may charge a battery or other electrical storage device.

The inverter may be configurable as a bidirectional inverter for converting DC to AC and AC to DC, the bidirectional inverter comprising one or more DC ports for receiving or outputting one or more DC voltages, and one or more AC ports for inputting or outputting one or more AC voltages.

LIST OF FIGURES

The present invention will now be described, by way of example only and with reference to the accompanying figures, in which:

FIG. 4b shows a perspective detail of FIG. 4a;

FIG. 7b shows an equivalent circuit diagram of the inverter of FIG. 7a;

FIG. 9a shows a schematic drawing of top holed coolant medium nozzle plate;

FIG. 9b shows a schematic drawing of middle coolant medium distribution plate;

FIG. 9c shows a schematic drawing of heatsink-busbar;

FIG. 9d shows a schematic perspective drawing of arrangement of top, middle and heatsink-busbar plates;

FIG. 9e shows a schematic plan drawing of composite of top middle and heatsink-busbar plates;

DETAILED DESCRIPTION OF THE PREFERRED EMBODIMENTS

In brief, the present invention relates to a semiconductor cooling arrangement in which one or more semiconductor assemblies are located in a chamber within a housing. The housing comprises inlet and outlet ports for receiving and outputting a cooling medium. The chamber is flooded with a cooling medium to cool the assemblies. The assemblies themselves each comprise a heatsink and one or more semiconductor power devices thermally coupled to the heatsink. The heatsink comprises heat exchanging elements in the form of a plurality of holes in the heatsink extending through the heatsink from one surface to another surface such that the cooling medium flows through the holes to extract heat from the heatsink.

Figure 1:
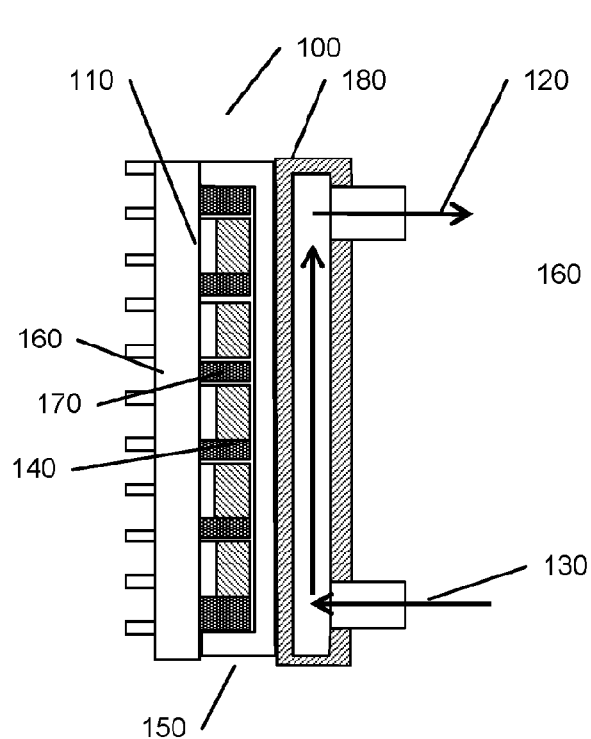
FIG. 1 shows a schematic drawing of indirect fluid cooling of a semiconductor device according to the prior art.
Figure 2:
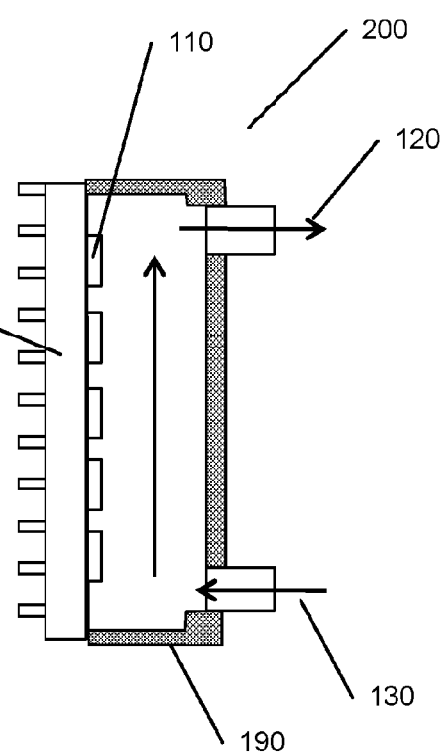
FIG. 2 shows a schematic drawing of direct fluid immersion cooling of a semiconductor device according to the prior art.

With reference to FIGS. 1 and 2 there is seen in schematic format semiconductor device cooling arrangements 100, 200 which are typical prior art approaches to cooling used for high heat flux components. There is shown an indirect means of heat removal FIG. 1 for a group 100 of semiconductor devices 110 mounted to a substrate 160.

Semiconductor devices 110 are thermally connected to a thermal and electrically conductive capping material 150 which is also linked to the substrate 160 by electrically insulating but thermally conducting columns or walls 170. Heat dissipated in semiconducting devices 110 finds escape in to circuit board/substrate 160 and thereafter columns/wall 170 to capping material 150, heat from semiconducting devices 110 also finds a more direct link to capping material 150 by way of a thermal conducting but electrically insulating medium 140. Capping material 150 becomes the preferred heatsink by virtue of coolant fluid which is pumped into cavity 180 through port(s) 130 and exiting to a heat exchanger (not shown) via port(s) 120. Direction of coolant flow is shown by arrows. This indirect cooling approach maintains electrical isolation of semiconductor devices, but imposes thermal resistance between said devices and the eventual heatsink coolant fluid by using electrically insulating interposers.

In FIG. 2 there is shown a similar grouping 200 of high heat flux semiconducting devices 110 bonded to substrate 160, said devices being situated in a liquid tight casing 190. Semiconducting devices 110 and one side of substrate 160 are immersed in coolant fluid supplied by port(s) 130 and exiting by port(s) 120, coolant flow direction being shown by arrows.

It will be understood by those of reasonable skill in the art the arrangement of semiconducting devices 200 shown in FIG. 2 provides for one side of said devices to be in closer thermal contact with coolant fluid by virtue of components and substrate being wetted and immersed in said coolant fluid and is therefore more effective in removing heat than the situation shown in FIG. 1. This immersion approach benefits from component and substrate immersion, but does not allow for high packing density of discreet components nor removal of waste heat from non immersed wall sides.

Figure 3:
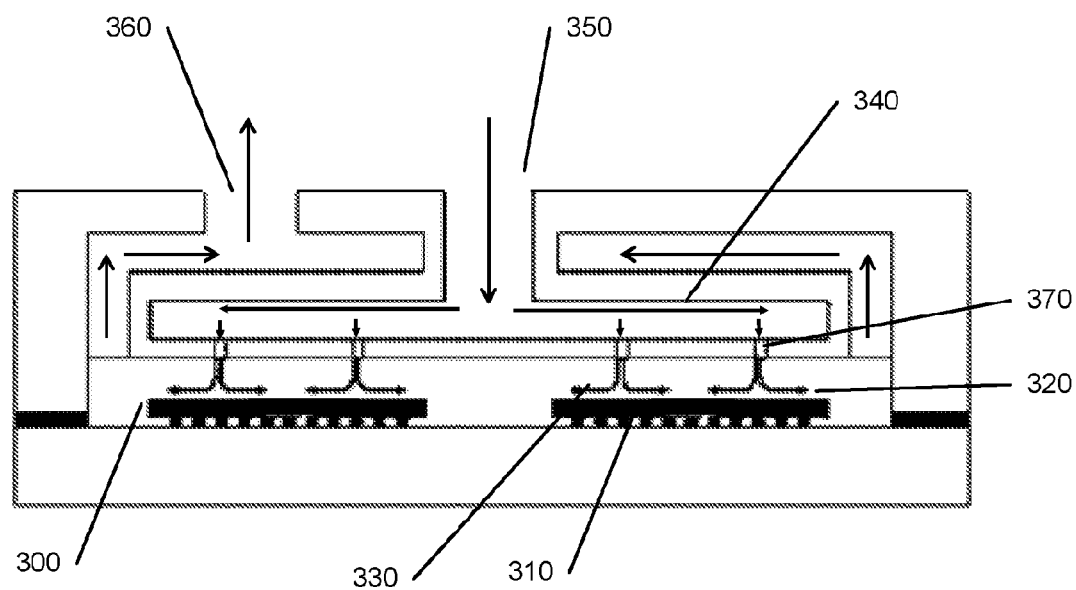
FIG. 3 shows a schematic drawing of direct fluid immersion cooling of a bare chip semiconductor device according to the prior art.

A more elaborate approach to immersion cooling, also demonstrating the current prior art, is shown in FIG. 3 and has been applied to semiconductor devices 300 usually in flip-chip format that is with the active (diffused) side 310 of the semiconductor 300 facing an electronic circuit board/substrate, whilst the backside 320 of the semiconductor device faces an impinging jet 330 of coolant fluid. Coolant fluid is supplied to jet nozzles 370 by means of a plenum 340 and an input port(s) 350 and exits via port(s) 360. Fluid flow direction is shown by arrows. Impinging jets 330 of coolant fluid ensures turbulent flow where it is required i.e. on the surface of the chip backside 320.

Figure 4A:
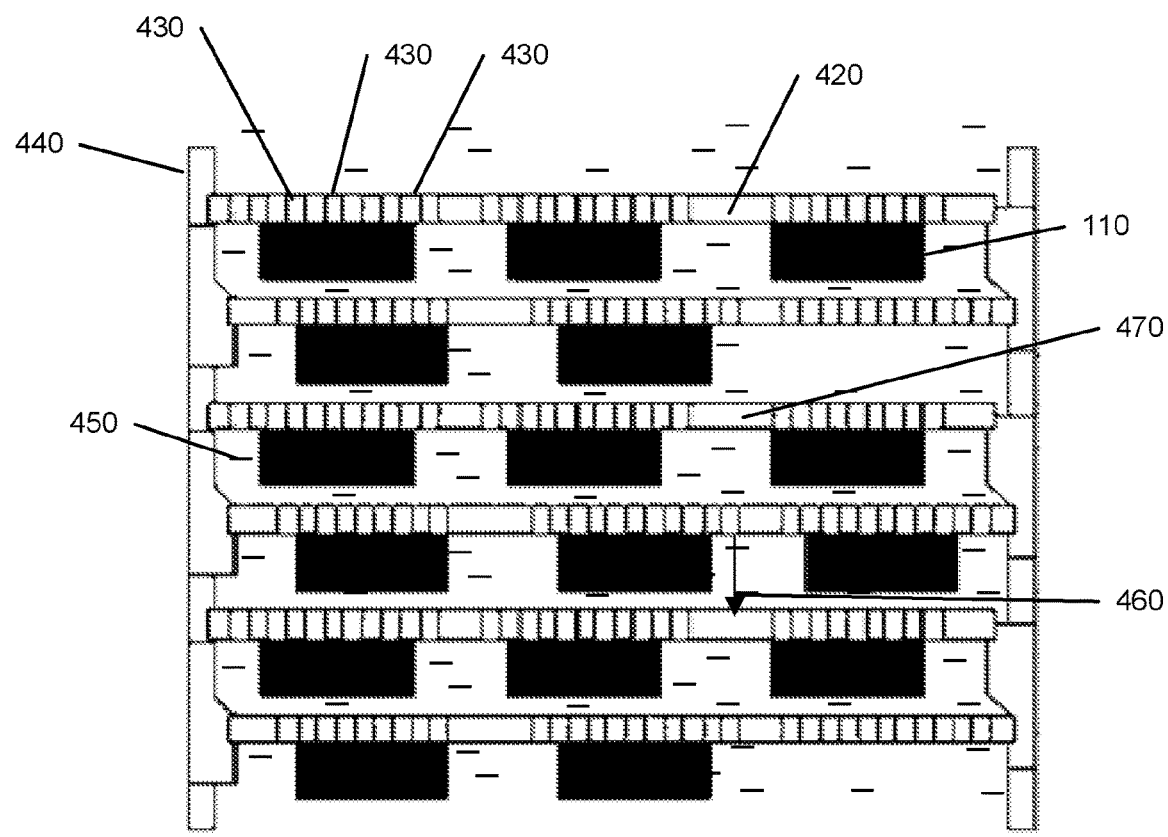
FIG. 4a shows a schematic drawing of semiconductor device cooling arrangement of the present invention.
Figure 4B:
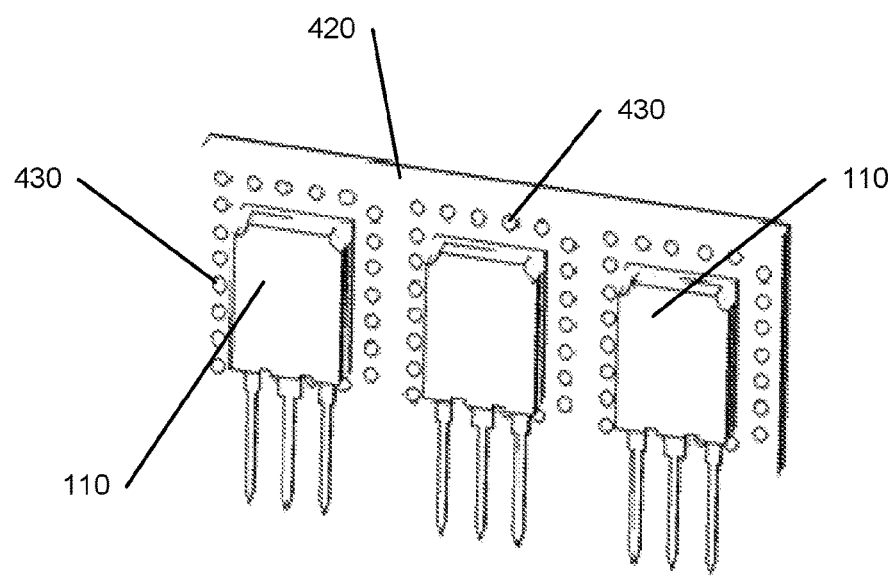
Figure 5:
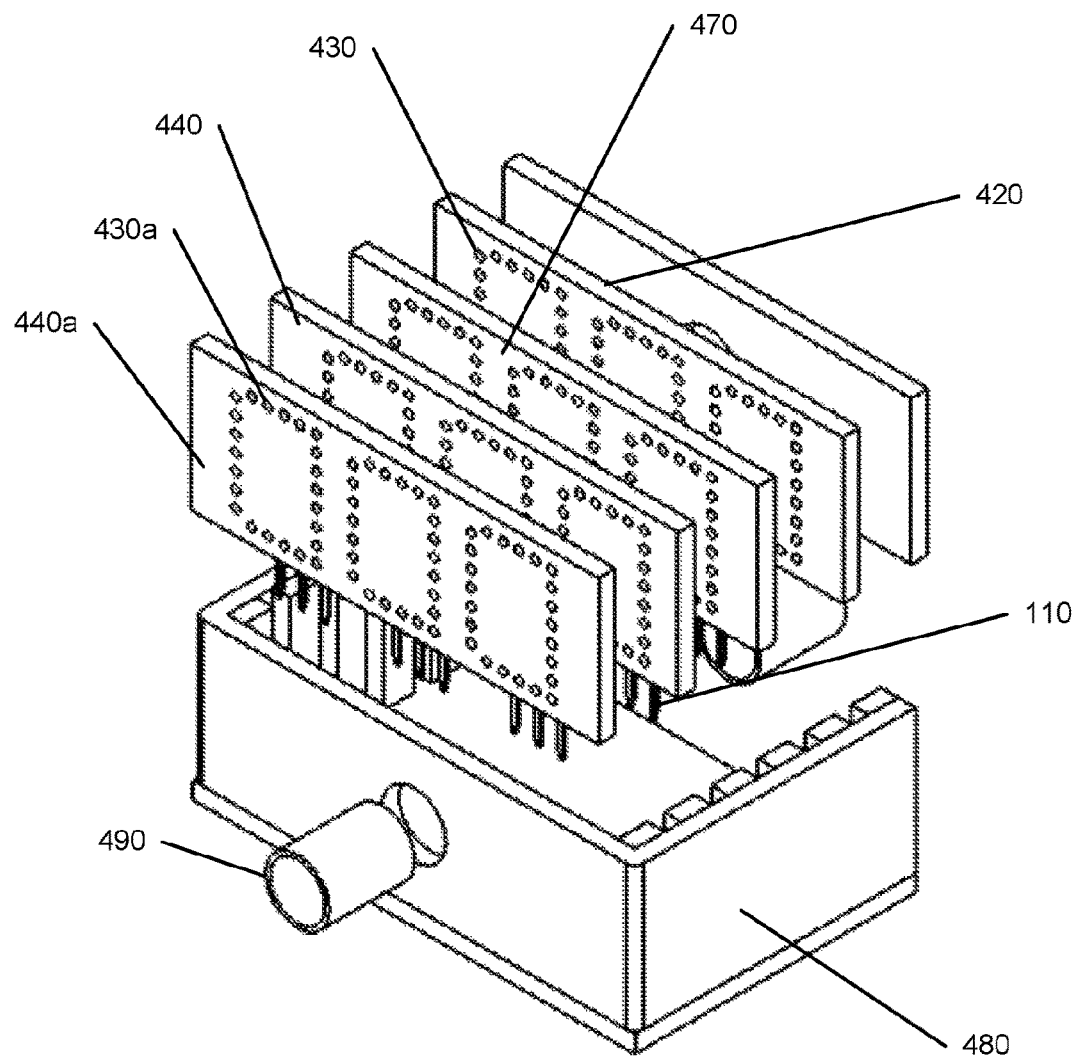
FIG. 5 shows a perspective drawing of semiconductor device cooling arrangement with casing of the present invention.

This cooling approach is effective for bare die, but requires flip-chip packaging and is not supportive of high packing densities nor high current, low inductance interconnects between devices With reference to FIGS. 4a, 4b and 5 there is seen an arrangement of semiconducting switch components 110 (though any heat dissipating component would benefit) mounted or bonded so as to be thermally coupled to the heatsink 420. In some embodiments, the semiconducting switch components 110 may also be electrically coupled to the heatsink in order to provide a heatsink performing two functions: that of cooling the components 110 and also providing means to electrically connect the switching components 110 together and to transmit power between the components, akin to a busbar. We will describe the system using the heatsink-busbar arrangement, but it should also be noted that the heatsink need not be configured as a busbar in order for the invention to be carried out, that is the invention does not rely on the heatsink functioning as a busbar in order to perform its cooling function.

The combined heatsink-busbars 420 comprise holes 430 that have been drilled to allow coolant medium to pass through and thereby remove heat from the heatsink-busbar 420 whilst minimising loss of heat spreading potential of the heatsink-busbar 420 available to heat dissipating semiconducting devices 110 mounted thereon. In its purist form, the invention relies on the heatsink with holes, where the heatsink, as part of the semiconductor module (that is the module comprising the switching components 110 and the heatsink 420), is submerged in a cooling medium. The cooling medium flows around the module and through the holes, which are configured to extract heat from the heatsink as the medium flows through the holes.

Being modular, multiple assemblies can be housed within the chamber comprising the cooling medium such that all of the assemblies are cooled. Such an arrangement is shown in FIGS. 4a and 5. Semiconducting switch components 110 are mounted side by side to form sub-modules 440 and sub-modules 440 are stacked so that holes 430 in one busbar heatsink 420 feed fluid dielectric coolant 450 in the form of impinging jets of coolant 460 on to subsequent sub-modules 440. Sub-modules 440 and their heatsink-busbar hole arrays 430a are preferably off-set one from another so that jets 460 of dielectric coolant 450 formed by an adjacent sub-module's array of holes 430a do not coincide with the next sub-module hole arrays, but rather jets impinge on semiconductor switch components 110 or solid regions of busbar heatsink 470. Offsets between adjacent module hole arrays may be small or large so long as hole arrays do not coincide. Impingement of fluid jets creates turbulence which maximises removal of heat from surfaces.

The use of dielectric fluid immersion and fluid jet impingement cooling of semiconductor submodules and semiconducting device switches combined with the holes in the heatsinks is particularly advantageous in cooling the switches.

The use of heatsinks as electrical interconnection between heat dissipating power semiconducting devices is also advantageous, since this provides very low inductance, which means the devices can be driven harder and switched faster. Preferably the devices are soldered or equivalently bonded to the heatsink busbars in order to provide for a low electrical and thermal resistance between the switches and the heatsink.

All of these advantages provide a surprising improvement in power handling ability for power devices, such as power inverters, using the cooling arrangement of the present invention. Power densities are improved significantly over the present-day best in class power inverter module. Inverters utilising the present invention can be half the size of inverters of the prior art having the same power ability.

In FIG. 5, semiconducting switch devices 110 are mounted to heatsink-busbars 420 in groups to form sub-modules 440. Casing 480 may be used to arrange sub-modules 440 in a regular array wherein pitch and placement of submodules 440 is such as to optimise coolant jet impingement and maximise cooling effect.

An input port(s) 490 provides coolant fluid into casing 480 and first sub-module 440a may provide a barrier to coolant flow except through hole arrays 430a, which may cause jetting of the cooling medium through the holes on to the subsequent sub-module 440. Spacing/distribution of said holes 430 will influence the cooling of semiconductor devices 110, with too many holes 430 surrounding a device, or too small a gap between holes 430 preventing heat spreading away from said device 110. Holes 430 may be in a single array as shown 430a or in a double or more concentric array (not shown).

Output port(s) not shown may be to the outside of the semiconducting system and to separately mounted heat exchanger and pump (not shown)

Whilst FIG. 5 shows an input port on one side of the casing 480, the placement of the input port(s) could be elsewhere. For example, they could be located on the upper surface of the casing (not shown) such that the cooling medium is fed from the top down. Output ports(s) (not shown) could, in this scenario, be located in any of the sides of the casing 480. Of course, other configurations would be possible to ensure that there is a suitable distribution of the cooling medium throughout the chamber.

The input and output port(s) could also be configured to provide preferential flow of cooling medium in desired areas of the chamber. For example, the assemblies may be configured such that the power semiconductor devices (which produce the most heat) are grouped together, and the lower power components (capacitors and resistors and the like) may be grouped together, but separately from the power semiconductor devices. In such an arrangement, the input and output port(s) may be configured to provide more cooling medium flow to the power semiconductor components, and a comparatively reduced flow of the cooling medium to the lower power components. For example, 51% to 99% of the flow may be attributed to the areas of the chamber holding the higher power components, and 49% to 1% (respectively) of the cooling medium flow attributed to the lower power electronics. A preferred ratio of cooling medium flow is considered 95%/5% higher power devices to lower power devices.

This may be achieved by using separate input ports configured to feed different areas of the chamber with the cooling medium, where the input port feeding the area of the chamber holding higher power devices has a greater bore than the input port feeding the area of the chamber holding the lower power devices.

Heatsink-busbars 420 are preferably made from electrically and thermally conducting material such as copper or aluminium or their alloys or any material which will both thermally and electrically conduct and provide electrical interconnection between semiconductor devices 110 and provide thermal pathways for heat dissipated in semiconductor devices to dissipate. Heatsink-busbars of the present invention are an integral part of the electronics electrical circuit.

Means of bonding/attaching/mounting semiconducting devices 110 to heatsink-busbars 420 may be mechanical e.g. via nut and bolt, or by soldering or brazing, or by using a room temperature liquid metal, or by electrically and thermally conductive adhesive or by vibration welding or any method that achieves thermal and ohmic electrical connection.

Figure 6:
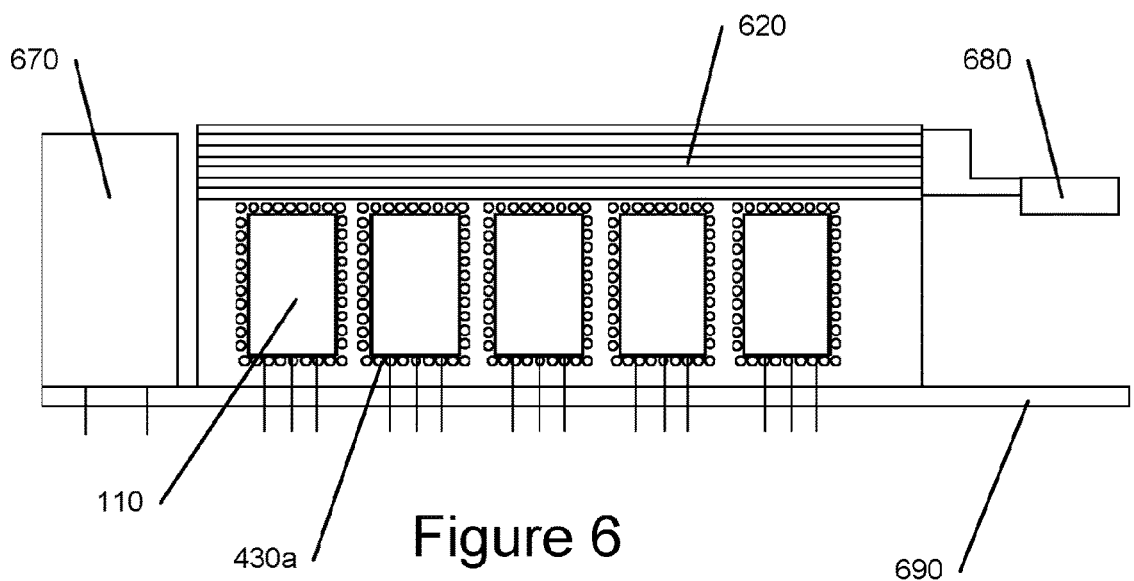
FIG. 6 shows a schematic drawing of a finned and holed heatsink-busbar of the present invention.

Heatsink-busbars of the present invention may be planar as represented in FIG. 4a or maybe extruded and finned 620 and additionally have arrays of holes 430a as shown in FIG. 6 which also shows other components of a semiconductor power device, such as an inverter, including capacitor(s) 670, electrical connector 680 and printed circuit board 690 for further integration of components.

Figure 7A:
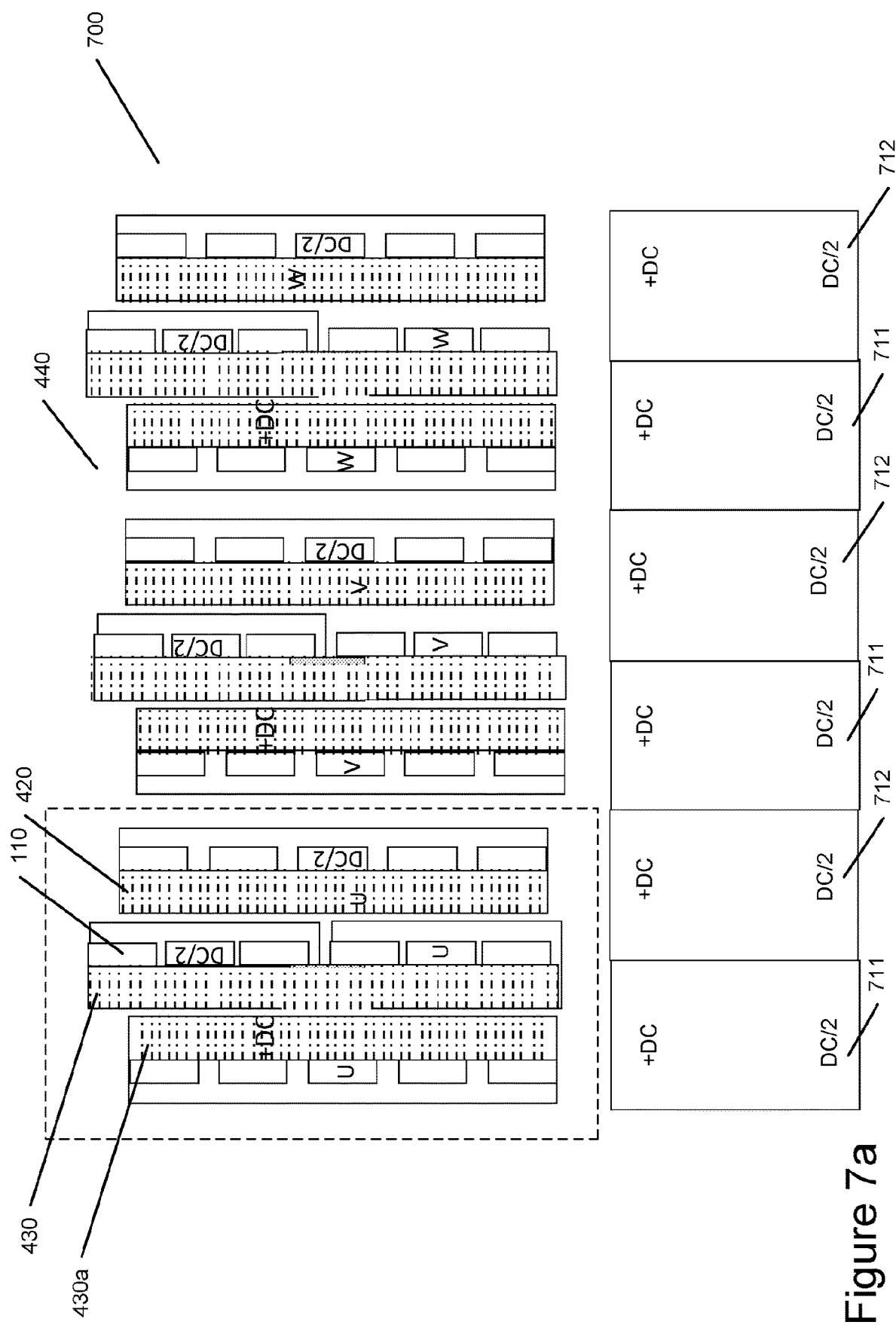
FIG. 7a shows a schematic drawing of an assembly of inverter submodules.
Figure 7B:
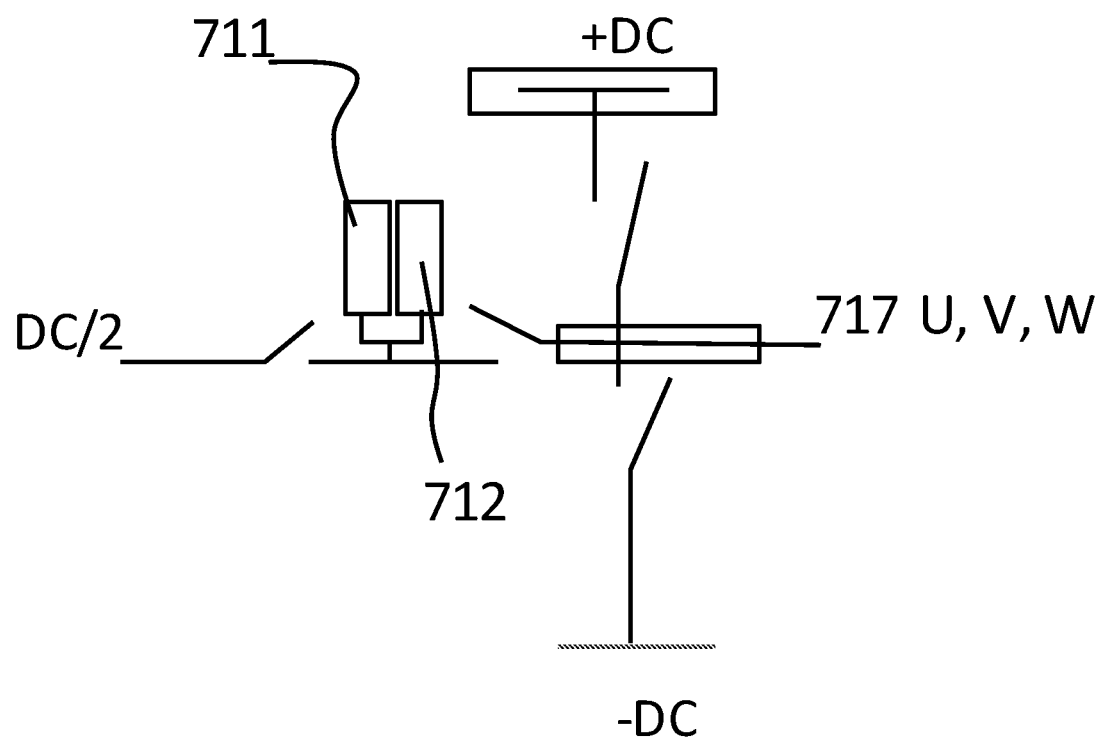

FIGS. 7a and 7b shows an example arrangement of sub-modules 440 configured as an inverter with hole array heatsink-busbars 420. This particular example shows a 3 level T-type inverter module 700 with heatsink-busbars 420 having arrays of holes 430a for passage and formation of coolant fluid jets.

Three phases are denoted by letters U, V, W and single phase "U" module is shown by a dashed outlined. Capacitors 711 and 712 enable splitting of DC supply rail +ve and −ve DC as may be seen in FIG. 7a and phase outputs 717 (U, V, W) show the essential part the heatsink-busbars play in completing the inverter module 700 circuit. Other arrangements, such as a two-level inverter are also possible, as well as single-phase varieties of each of the above.

Given the demonstrable advantageous cooling performance of the cooling arrangement of the present invention, such an inverter can be made having a significantly smaller footprint for the same performance levels of a much larger inverter(s).

Figure 8:
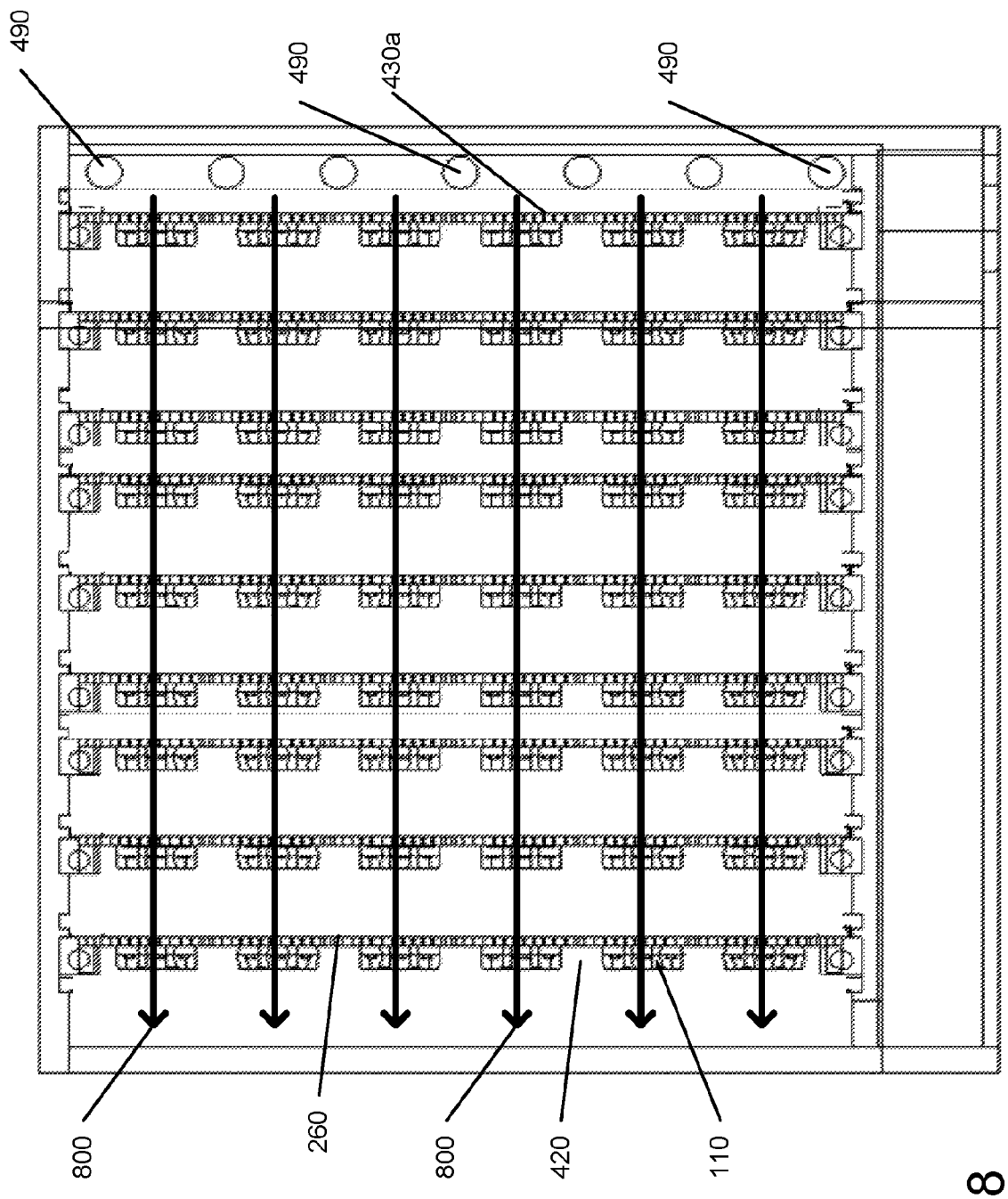
FIG. 8 shows a schematic plan drawing of an arrangement of heatsink-busbar inverter sub-modules of the present invention showing general coolant medium flow direction.

With reference to FIG. 8, symmetry of phase modules is a tool in minimising voltage resonances developed by fast switching of semiconducting devices 110. Another tool in reducing voltage spikes is minimising inductance in all three phase modules and the present invention enables symmetry and low inductance by virtue of using heatsinks as busbars. It is electrical symmetry and low inductance that allows higher switching speeds and additional power to be passed through semiconducting devices 110 whilst exceptional cooling of said devices 110 is achieved by mounting semiconducting device switches 110 directly to heatsinks 420 and to use the heatsinks 420 as electrical connections between said devices 110.

Thermal resistance for semiconducting devices 110 that are electrically connected to heatsinks 420 is considerably lower than if said devices 110 were electrically isolated from said heatsinks 420 by a non-electrically conductive layer. In the prior art, achieving similar thermal resistance values between multiple devices that are electrically isolated from heatsinks to which they are mounted is difficult to achieve in production and the weakest link (highest thermal resistance) becomes a limit on power dissipated. Uniformity of thermal and electrical connection is high for semiconducting devices 110 soldered to heatsink-busbars 420 and high uniformity can be achieved in production.

With excellent thermal connection achieved between semiconductor devices 110 and heatsink-busbars 420 enabled by solder connection, there is considerable thermal advantage gained through immersion of sub-modules 440 in a flowing coolant fluid and yet further considerable thermal advantage found by increasing the local surface area for heat removal by drilling or stamping holes 430 in said heatsink-busbar in an array peripheral to said mounted semiconducting devices 110.

Laminar flow of a coolant medium has low efficiency in removing heat from a substrate because said coolant medium has low velocity and may even be stationary in layers close to solid surfaces and in this instance heat is transferred by diffusion. In contrast flow of coolant medium through arrays of holes 430a, generates turbulent flow even for apparently low flow rates of coolant medium and turbulence is further enhanced by impingement on solid surfaces orthogonal to general coolant flow direction (shown by arrows 800), said coolant medium having to change direction before again being caused to flow through new arrays of holes 430a by virtue of offsets between said arrays.

An additional means of increasing the cooling ability of the heatsink and to ensure turbulent flow is shown in FIGS. 9a-e. A sequence of two plates 910, 920 providing even distribution of coolant medium to semiconducting device switches 110 mounted on heatsink-busbar 240, wherein a first plate 910 is patterned with arrays of holes 430a that match position of semiconducting devices 110 mounted to a heatsink-busbar 240 which also has arrays of holes 430 peripheral to said semiconducting device switches 110 mounted thereon. Sandwiched between plate 910 and heatsink busbar 240 is coolant guide plate 920 that serves to guide coolant fluid passed through hole arrayed plate 910 and impinging on to semiconducting devices 110 mounted on heatsink busbar 240, said guide plate 920 having guiding fingers 930 which serve to guide coolant fluid in a uniform distribution over the surface of semiconducting device switches 110 to said device periphery and through holes 940 there situated.

In embodiments sequences of plates 910, 920, 240 are sandwiched FIG. 9e, to form a cascade array of several such sequences with temperature of the final sequence heatsink-busbar element being a controlling factor in system power handling performance.

Figure 10:
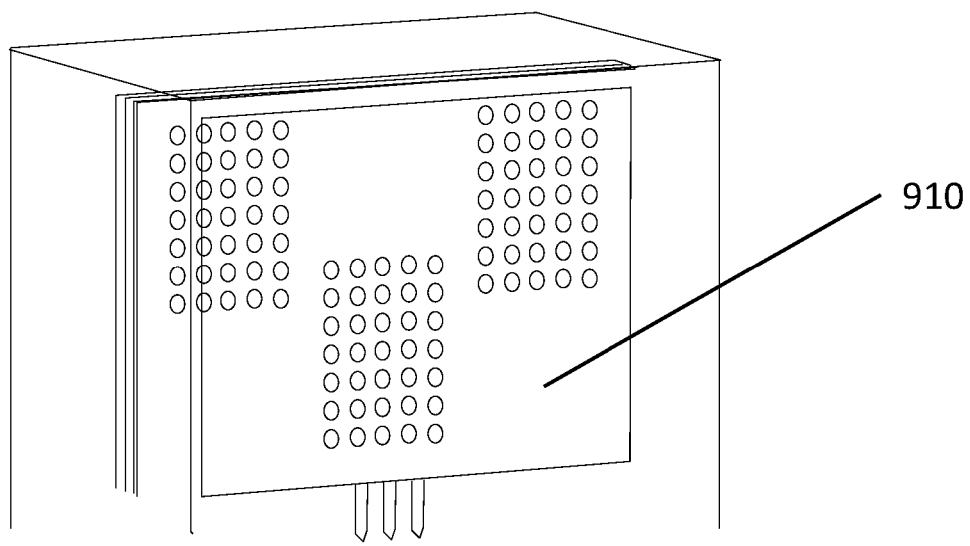
FIG. 10 shows a perspective drawing of composite of top middle and heatsink-busbar plates.
Figure 11:
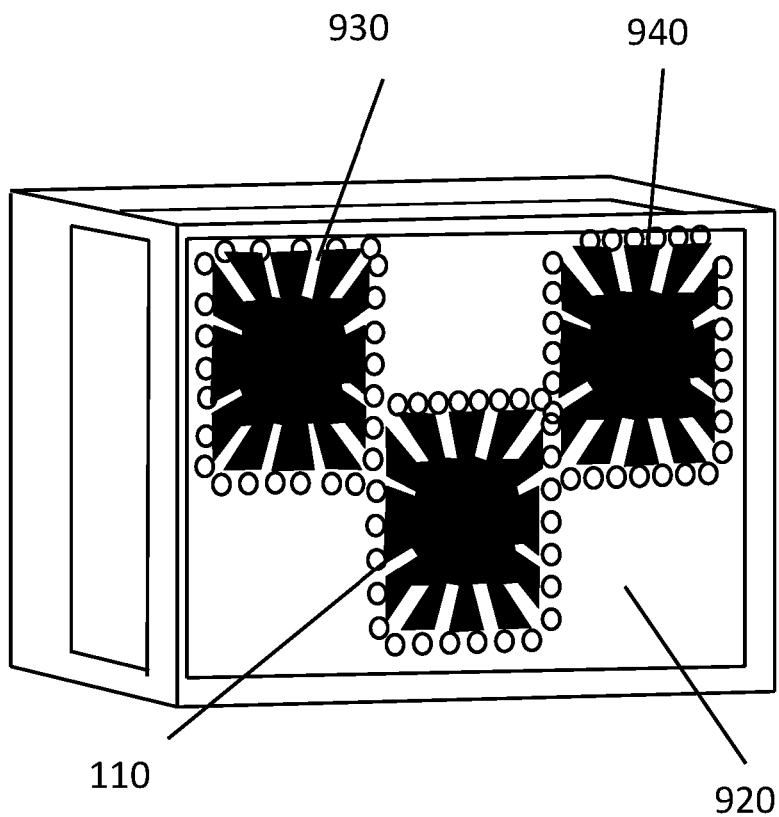
FIG. 11 shows a perspective drawing of composite of middle and heatsink-busbar plates.

FIG. 10 shows a perspective view of a sequence of plates 910, 920 and 240 of the present invention and to aid understanding FIG. 11 has plate 910 removed and thereby shows mid plate 920 mounted on heatsink busbar plate 240 showing guiding fingers 930, peripheral holes 940 in plate 920 and semiconducting device 110.

Whereas heatsink-busbar 240 is electrically and thermally conducting, there is no such requirement for plates 910 and 920 which may or may not be insulating and may advantageously be polymer injection moulded or stamped or otherwise mass produced.

Figure 12:
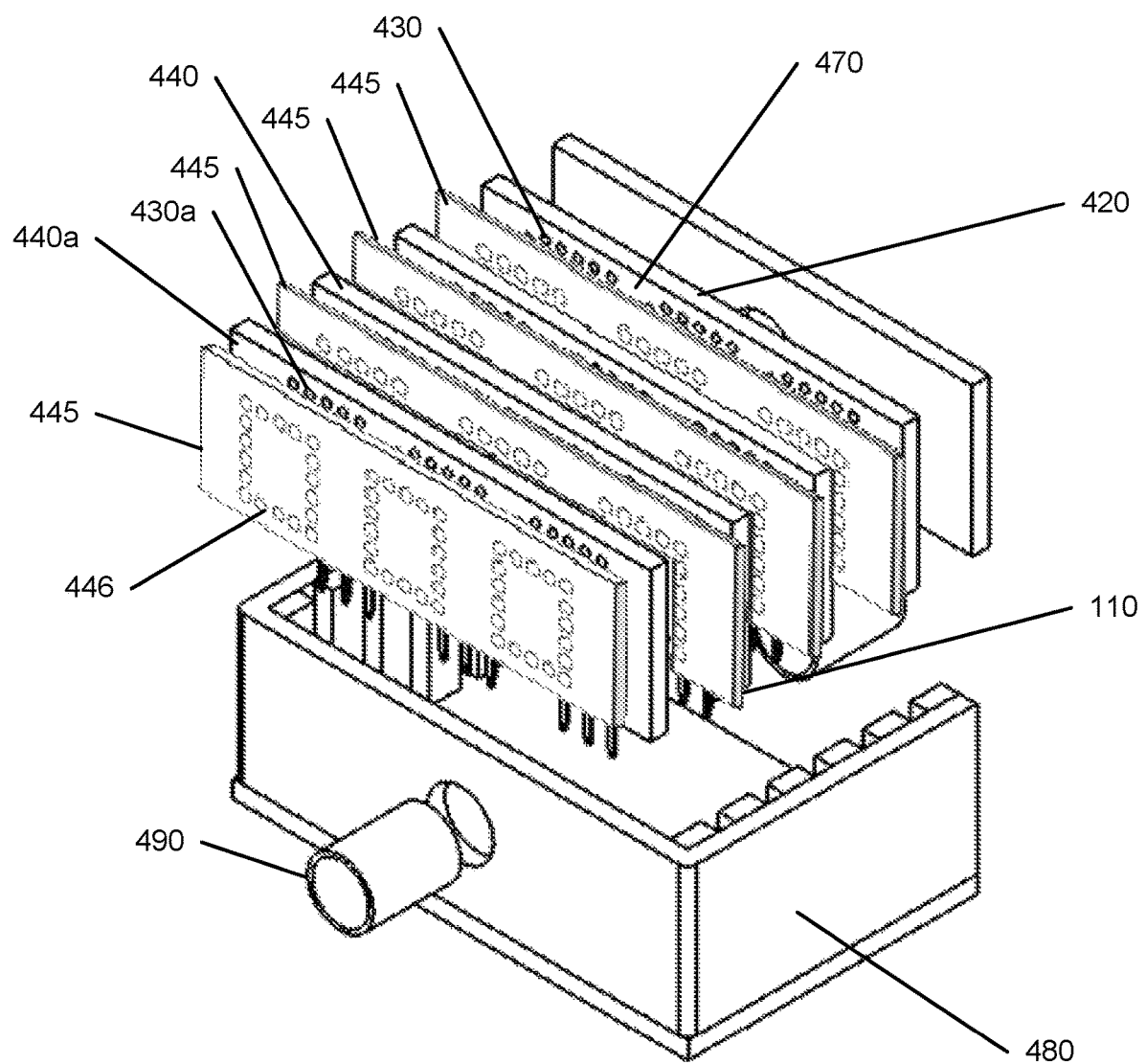
FIG. 12 shows a perspective drawing of semiconductor device cooling arrangement with casing incorporating a baffle.
Figure 13:
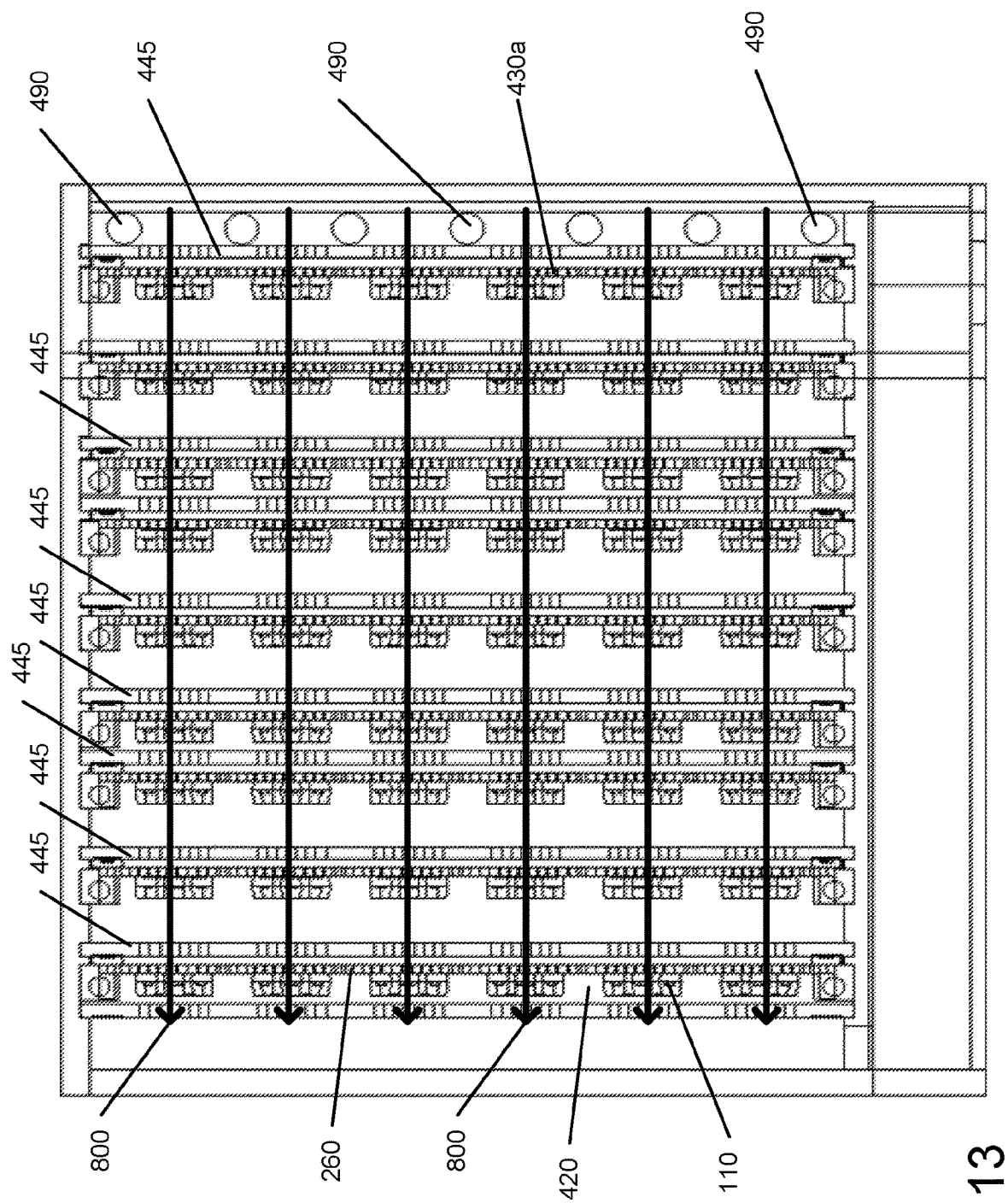
FIG. 13 shows an alternative schematic plan drawing of the arrangement of FIG. 8 incorporating baffles.

An alternative way of increasing the cooling ability of the heatsink and to ensure turbulent flow is shown in FIGS. 12 and 13.

FIG. 12 shows an arrangement similar to that of FIG. 5, with the addition of one or more baffle plates 445. The purpose of the baffle plate is to produce jets of cooling medium that hit the surface of the heatsink 420 and/or the semiconductor power devices 110, and preferably to create turbulent flow of the cooling medium.

The baffle plate 445 comprises one or more regions 446 of through-holes in the plate. The through holes 446 may be arranged in a similar form to that of the through-holes in the heatsinks (as shown in FIG. 12). Alternatively, and preferably, a plurality of through-holes 446 are provided in an array. The array may be a similar size to the surface of the heatsink occupied by the semiconductor power device. The location of each array 446 is preferably aligned to the position of a respective semiconductor power device on an adjacent heatsink.

The plate may be made of metal or a dielectric. Preferably, the plate 445 is made of a dielectric, as this allows the plate 445 to be located very close to the heatsink without voltage concerns, for example within approximately 2 mm. The close proximity of the baffle plate 445 to the heatsink increases the cooling effect of the turbulent cooling medium. Furthermore, when the baffle plates are made from a dielectric material, and when located closely with the heatsinks, this enables neighbouring heatsinks to be located closer together due to the dielectric nature of the baffle plates, adding a layer of electrical insulation between the heatsinks.

Whilst FIG. 12 only shows one baffle plate 445 within the casing 480, this is only for illustrative simplicity. Preferably, baffle plates 445 are located within the flow path of the cooling medium and adjacent to each of the heatsinks within the casing 480.

As with the device shown in FIG. 5, the device shown in FIG. 12 shows semiconducting switch devices 110 mounted to heatsink-busbars 420 in groups to form sub-modules 440. Casing 480 may be used to arrange sub-modules 440 in a regular array wherein pitch and placement of submodules 440 is such as to optimise coolant jet impingement and maximise cooling effect.

The input port(s) 490 provides coolant fluid into casing 480. The baffle plate 445 causes jetting of the cooling medium through the through-holes on to the subsequent sub-module 440a. Since it is preferred to have each baffle plate 445 very close to the respective heatsinks, it is possible that two baffle plates 445 may be preferred between the inlet 490 and the first sub-module 440a; a first between the inlet and a second baffle plate, and the second baffle plate very close to the first sub-module 440a. Preferably, each sub-module heatsink is co-located closely with a respective baffle 445 as described above in order to create the turbulent flow of cooling medium.

FIG. 13 is a modified version of FIG. 8, and comprises a plurality of baffle plates 445 as described with reference to FIG. 12.

The combination of the holes in the heatsink, combined with the use of baffles as described above makes for an effective cooling mechanism. The baffle plates cause jet impingement on the back surface of the heatsink, and turbulent flow, which increases the heat transfer from the surface of the heatsink into the cooling medium. The heatsink has holes that let the fluid pass through it, which cools the semiconductor power devices bonded to the front of the heatsink. The holes in the heatsink are placed around the power devices to get maximum surface area close to the hot power devices backs. The fluid then mixes and swirls around the fronts of the power devices before being forced through the next baffle plate. This then repeats.

It has been demonstrated that have lots of swirl (turbulence) around the fronts of the power devices and the legs accounts for up to 30% of the heat removed from the power device package.

Advantageously, having mixing of the fluid while it swirls so that the next set of jets have the average temperature avoid hot spots down the line of heatsinks.

Furthermore, the baffle(s) used as shown in FIGS. 12 and 13 may also be used in conjunction with the scheme described in FIGS. 9a-d.

Figure 14A:
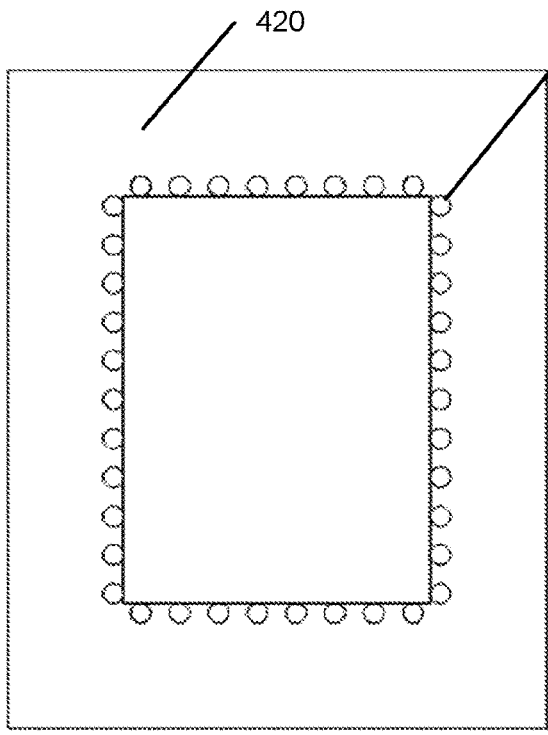
FIGS. 14a and 14b show the semiconductor device cooling arrangement having different hole configurations.
Figure 14B:
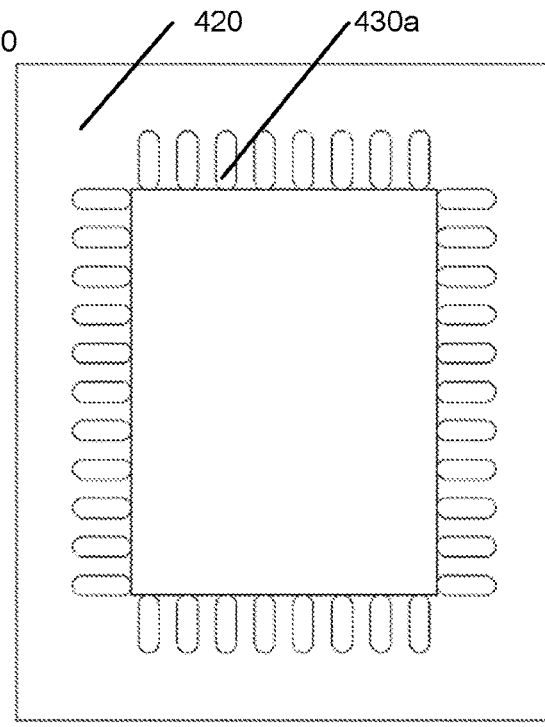
Figure 14C:
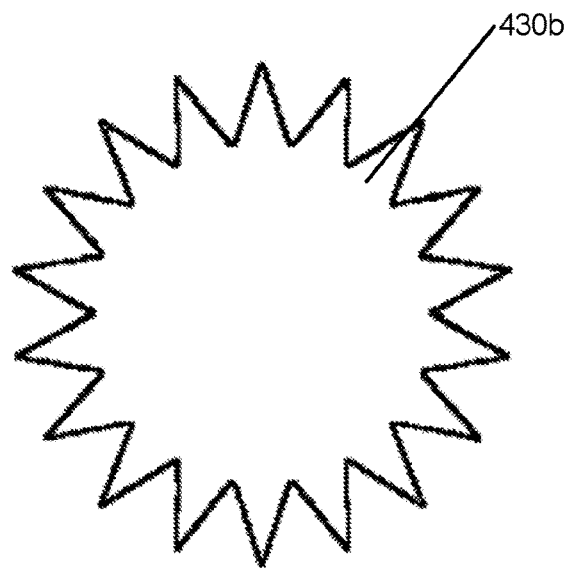
FIG. 14c shows an example star hole configuration for the semiconductor cooling arrangement.
Figure 15A:
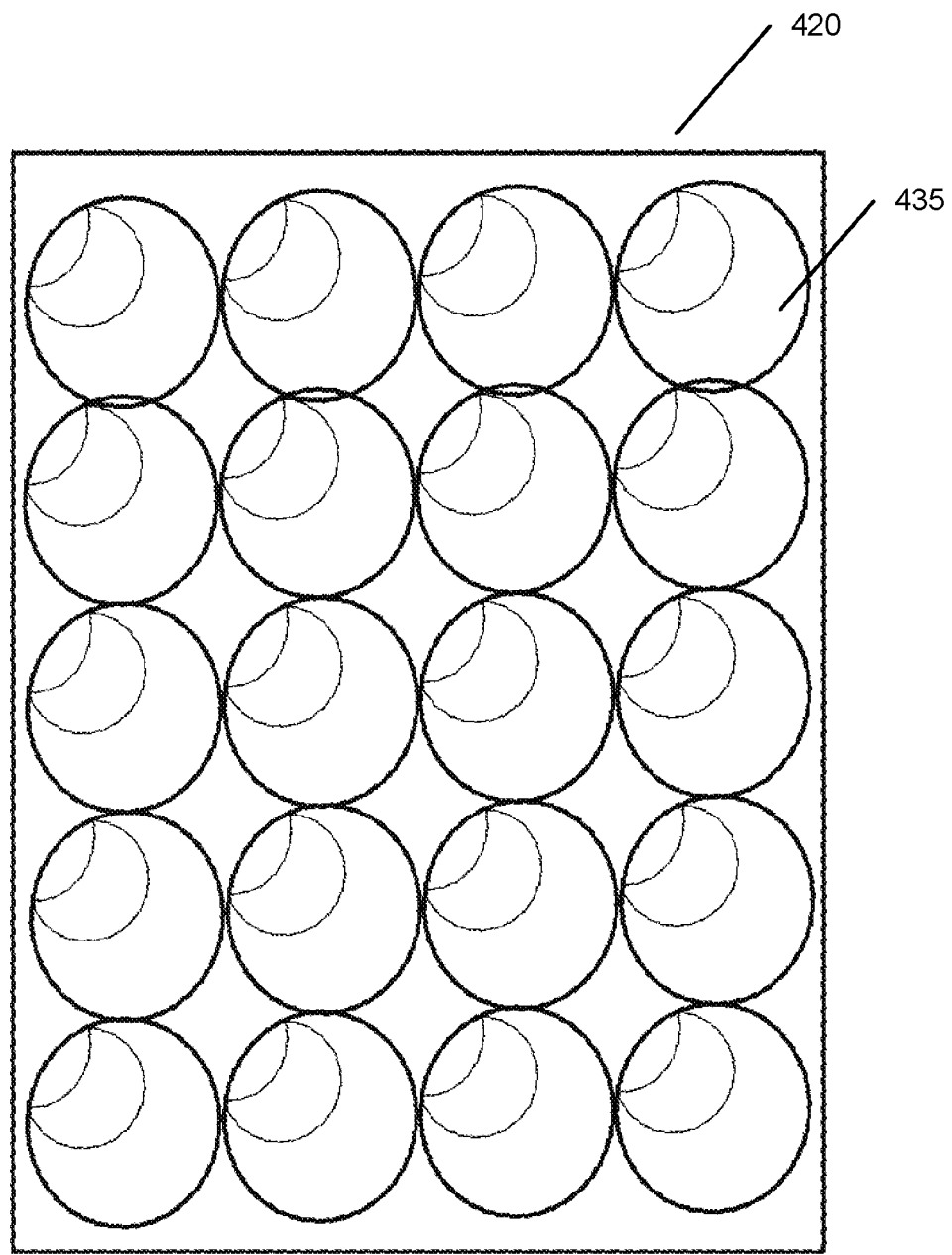
FIGS. 15a and 15b show hole configurations for the semiconductor cooling arrangement and/or baffle.
Figure 15B:
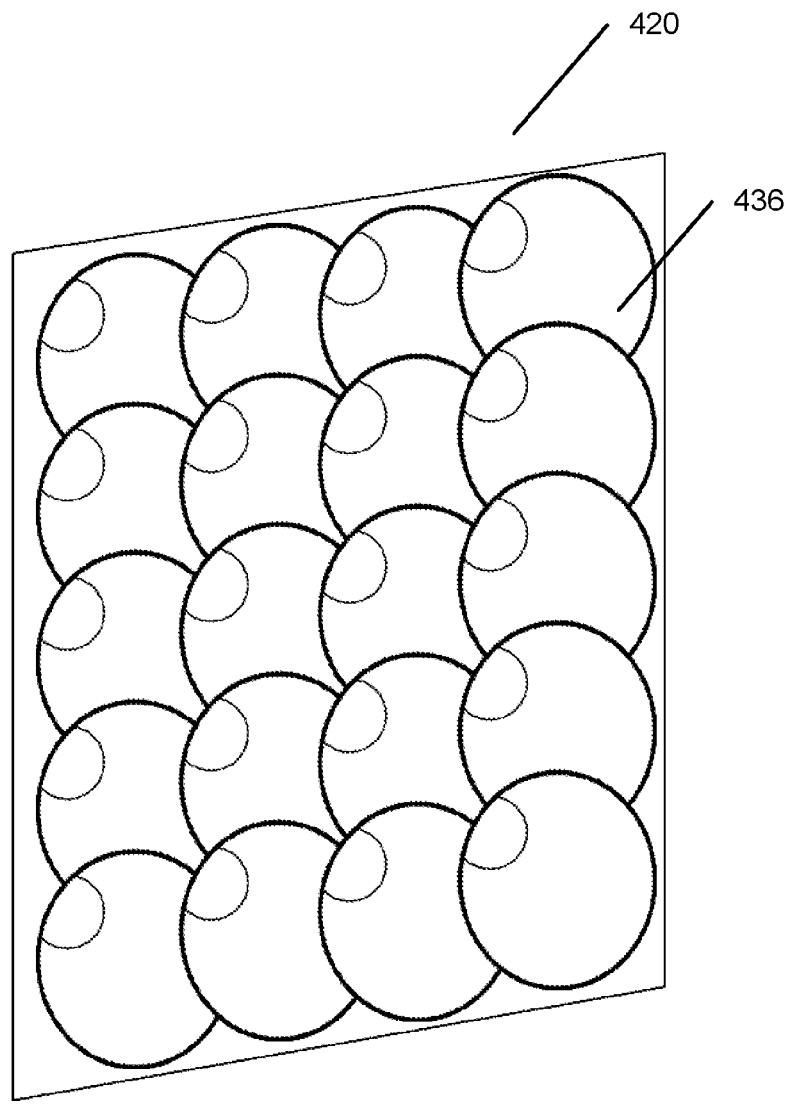

FIG. 14a, b, c and FIGS. 15a and 15b show different configurations and shapes of holes that may be used on the heatsink and/or on the baffle plate, when one or more are used. FIG. 14a shows round holes, 14b shows rectangular holes (these could be provided with rounded or square edges) and 14c shows a star shape.

FIGS. 15a and 15b show a rounded shape of hole that is countersunk to different depths. FIG. 15a has a partial countersunk profile, whereas FIG. 15b shows a profile where the hole is countersunk to the opposing surface. As example dimensions start at the far surface with a diameter of 2 mm, expanding over the depth of the baffle plate. They may or may not overlap at the wider end of the hole, depending on the distance between the holes.

Whilst the holes are shown in an array, for example when used in the baffle plate, such holes may be used in the configuration used for the heatsink, that is a single row of holes surrounding a profile of the semiconductor power device.

Figure 16A:
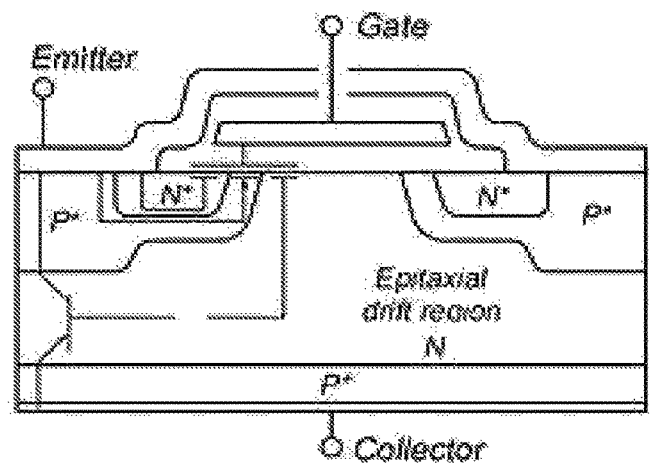
FIGS. 16a to 16d show, respectively a) construction diagram for insulated gate bipolar transistor switch (IGBT); b) symbol of IGBT; c) 3-pin IGBT device for mechanical mounting; and d) 3-pin IGBT device for solder mounting.

FIG. 16a, is a schematic diagram of the construction of an insulated gate bipolar transistor (IGBT) one type of semiconducting switch device used in power inverter assemblies of the present invention. IGBTs are voltage operated devices with high current flow between emitter and collector being controlled by voltage between gate and emitter. Because both majority and minority carriers are utilised in current flow, IGBTs have high current capability for relatively low applied gate voltage. It is these high currents and the switching thereof which is where the present invention provides advantage in cooling and in minimising losses. Alternative switches are characterised by the following list: MOSFET metal oxide semiconductor field effect transistor, power diode, bipolar transistor and thyristor-type.

Figure 16B:
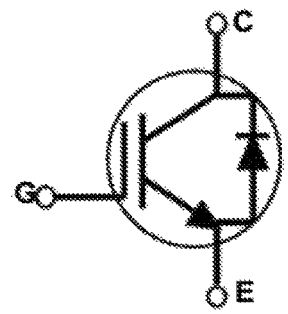

A commonly used symbol FIG. 16b for IGBTs shows a C representing collector (drain). The collector is frequently electrically attached to the heatsink base plate 935

Figure 16C:
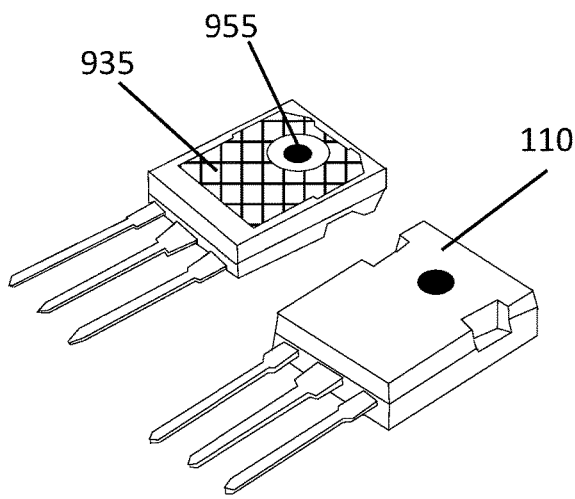
Figure 16D:
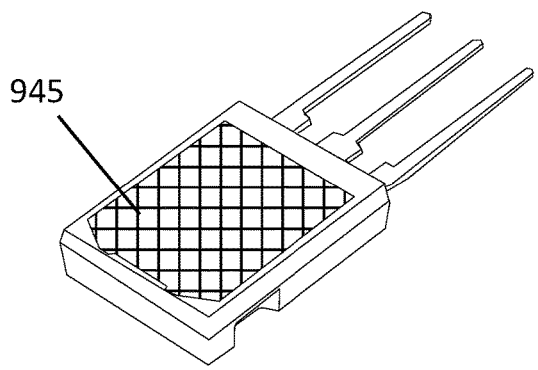

FIG. 16c of the device. An attachment hole 955 may be used to firmly clamp said device 110 to a heatsink-busbar of the present invention, so long as good thermal and electrical connection is achieved. However and IGBT with a tin plated aluminium heatsink 945 can be soldered directly to similarly tin coated aluminium or bare copper heatsink-busbars of the present invention thereby providing a thin, high thermal conductivity pathway of correspondingly low thermal resistance between the IGBT and the heatsink-busbar.

Whilst we have described the inverter being configured to convert a DC voltage to an AC voltage, for example for powering an electric motor, the inverter could instead be configured as an inverter to convert an AC voltage into a DC voltage. Such inverters may be useful for charging a battery or other electrical storage device. Furthermore, the inverter may instead be configured into a bidirectional inverter, which may covert between AC to DC and DC to AC voltages.

Coolant medium used in the present invention is a dielectric fluid for example, a poly alpha olefin (PAO), fluorocarbon fluid such as Fluoronert™, coolant fluids may be single or dual phase and cooling may be derived from liquid heat capacity or heat of vaporisation, such coolant media are well known and are useful for cooling electronic components, and systems e.g. semiconductor devices, capacitors and resistors and sub-assemblies assembled to form inverters and controllers. Said coolant may also be used to cool electric machines e.g. motors/generators that may be powered/controlled by said electronic systems.

In an example application of the above discussed aspects, a semiconductor arrangement is made from standard robust power (packaged) device IGBTs solder bonded to an aluminium heatsink, used as a busbar, 2 mm in thickness where IGBT devices are peripherally surrounded by 2 mm diameter holes spaced 2 mm apart. Additional control and low heat dissipating devices and power storage capacitors are mounted to standard printed circuit board in the usual manor and interconnected with IGBT devices via their pin legs. The whole inverter arrangement is submerged in a dielectric fluid where the cooling fluid is preferentially flowed across the busbar mounted components and through the peripheral holes in the heatsink.

It is found that a 100 kW channel cooled power inverter with 90% efficiency is improved in thermal capacity by 50% in the same physical envelope such that 150 kW inverter power is available from this example. Additionally it is found that power devices of different voltage potential when submerged in a dielectric fluid can be mounted in closer proximity than is possible in an air environment providing potential for even greater power density.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A semiconductor cooling arrangement, comprising:
one or more semiconductor assemblies, each assembly comprising a heatsink and one or more semiconductor power devices directly mounted on and thermally coupled to the heatsink;
a housing for housing the one or more assemblies in a chamber within the housing, the housing comprising inlet and outlet ports in fluid communication with the chamber respectively for receiving and outputting a cooling fluid, the chamber being flooded with a cooling fluid to cool the assemblies;
wherein the heatsink defines a plurality of holes that extend through a front face of the heatsink, onto which the one or more semiconductor power devices are directly mounted, and a rear face of the heatsink opposing and spaced apart from the front face, such that the cooling fluid flows through the holes to extract heat from the heatsink, wherein the plurality of holes are arranged as a single row of holes surrounding the periphery of each of the one or more semiconductor power devices mounted to the heatsink.

2. The semiconductor cooling arrangement according to claim 1, wherein the heatsink has a flat form.

3. The semiconductor cooling arrangement according to claim 1, wherein, where there are two or more semiconductor power devices, areas in the heatsink between the single row of holes surrounding the periphery of neighboring semiconductor power devices are devoid of holes.

4. The semiconductor cooling arrangement according to claim 1, wherein the one or more semiconductor power devices are electrically coupled to the heatsink, and wherein the heatsink is a bus bar that electrically connects the one or more semiconductor power devices together to transmit power between the one or more semiconductor power devices.

5. The semiconductor cooling arrangement according to claim 1, wherein the one or more semiconductor power devices comprise an IGBT, Silicon carbide (SiC) semiconducting switch devices, metal oxide semiconducting field effect transistors (MOSFETs), or power diodes.

6. The semiconductor cooling arrangement according to claim 1, wherein the one or more semiconductor power devices are mechanically connected to or are bonded to the heatsink.

7. The semiconductor cooling arrangement according claim 1, wherein one or more of the semiconductor assemblies are mounted to a Printed Circuit Board (PCB), the PCB providing electrical connections between the one or more semiconductor power devices.

8. The semiconductor cooling arrangement according to claim 7, wherein the PCB and additional lower power electrical and electronic components mounted on the PCB are located within the chamber and immersed in the cooling fluid.

9. The semiconductor cooling arrangement according to claim 8, wherein the one or more semiconductor power devices are co-located within the chamber, and the lower power electrical and electronic components are co-located within a different area of the chamber to the one or more semiconductor power devices.

10. The semiconductor cooling arrangement according to claim 1, wherein the inlet port in fluid communication with the chamber is configured to flow cooling fluid more favourably in the areas of the chamber occupied by the one or more semiconductor power devices.

11. The semiconductor cooling arrangement according to claim 10, wherein the inlet and port in fluid communication with the chamber is configured to flow 51% to 99% of the cooling fluid in the areas of the chamber occupied by the one or more semiconductor power devices, preferably 95% of the cooling fluid flow.

12. The semiconductor cooling arrangement according to claim 1, wherein, when there are two or more semiconductor assemblies located within the chamber, each adjacent assembly is arranged to be offset from one another such that the holes of one heatsink are out of alignment with the holes in the next heatsink, such that the cooling fluid flows through the holes in one of the heatsinks and impinges on the surface of the next heatsink in the flow path of the cooling fluid.

13. The semiconductor cooling arrangement according to claim 12, wherein the two or more semiconductor assemblies are arranged parallel to one another.

14. The semiconductor cooling arrangement according to claim 1, wherein one or more heatsinks of the one or more assemblies comprise a cooling fluid distributor for distributing the cooling fluid.

15. The semiconductor cooling arrangement according to claim 14, wherein the cooling fluid distributor comprises first and second layers of a distributor attached to the rear face of the heatsink, where the rear face of the heatsink is the face of the heatsink opposing the face having the semiconductor power devices coupled thereto,
the first layer comprising an outer layer and having a plurality of holes extending between front and rear faces of the first layer, the holes being located on an area of the heatsink associated with the positions of the one or more semiconductor power devices; and
the second layer, sandwiched between the heatsink and the first layer, comprising a row of holes located in a position equivalent to a periphery of each of the semiconductor power devices coupled to the heatsink, and a plurality of guides extending inward of the position of the holes in the second layer to guide cooling fluid between the holes in the first layer and the holes in the second layer.

16. The semiconductor cooling arrangement according to claim 1, comprising one or more baffle plates arranged within the housing in the flow path of the cooling fluid between the inlet and the outlet, the one or more baffle plates comprising a plurality of holes in the baffle plate extending through the baffle plate between a front face and a rear face, such that the cooling fluid flows through the holes.

17. The semiconductor cooling arrangement according to claim 16, wherein each of the one or more baffle plates is arranged within the housing to be adjacent to a respective one of each of the one or more semiconductor assemblies and located in the flow path between the inlet and the respective semiconductor assembly.

18. The semiconductor cooling arrangement according to claim 17, wherein each of the one or more baffle plates is arranged within the housing to be within 1 mm to 5 mm, preferably 2 mm, of a respective one of each of the one or more semiconductor assemblies.

19. The semiconductor cooling arrangement according to claim 17, wherein the plurality of holes comprises one or more groupings of a plurality of holes in each baffle plate, each grouping of a plurality of holes being associated with a respective one of each of the one or more semiconductor power devices thermally coupled to the heatsink, and each of the grouping of the plurality of holes in the baffle plate are arranged to be in the flow path of the cooling fluid between the inlet and the respective one of each of the one or more semiconductor power devices.

20. The semiconductor cooling arrangement according to claim 19, wherein each of the one or more groupings of a plurality of holes comprises an array of a plurality of holes.

21. The semiconductor cooling arrangement according to claim 20, wherein each array of a plurality of holes is dimensioned to be of a similar width and height of the area of the heatsink covered by the respective one or more semiconductor power devices on the heatsink.

22. The semiconductor cooling arrangement according to claim 1, wherein the holes are configured to provide a turbulent flow of the cooling fluid.

23. The semiconductor cooling arrangement according to claim 1, wherein the holes have a circular, rectangular, rounded rectangular or a star shape.

24. The semiconductor cooling arrangement according to claim 1, wherein the diameter of the holes increases between the front face and the rear face.

25. The semiconductor cooling arrangement according to claim 1, wherein the cooling fluid is a dielectric cooling fluid.

26. The semiconductor cooling arrangement according to claim 1, wherein the cooling fluid is pumped between the inlet port and the outlet port.

27. The semiconductor cooling arrangement according to claim 1, wherein the inlet port and outlet port are coupled to a cooling circuit comprising a heat exchanger, the heat exchanger for removing heat from the cooling fluid.

28. The semiconductor cooling arrangement according to claim 1, wherein the one or more semiconductor assemblies form an inverter for converting between DC and AC.

29. The semiconductor cooling arrangement according to claim 28, wherein, when the inverter is configured to convert DC to AC, the inverter comprises one or more electrical inputs for receiving one or more DC voltages, and one or more electrical outputs for outputting one or more AC voltages.

30. The semiconductor cooling arrangement according to claim 29, wherein the output of the inverter powers an electric motor.

31. The semiconductor cooling arrangement according to claim 28, wherein, when the inverter is configured to convert AC to DC, the inverter comprises one or more electrical inputs for receiving one or more AC voltages, and one or more electrical outputs for outputting one or more DC voltages.

32. The semiconductor cooling arrangement according to claim 31, wherein the output of the inverter charges a battery or other electrical storage device.

33. The semiconductor cooling arrangement according to claim 28, wherein the inverter is as a bidirectional inverter for converting DC to AC and AC to DC, the bidirectional inverter comprising one or more DC ports for receiving or outputting one or more DC voltages, and one or more AC ports for inputting or outputting one or more AC voltages.

\* \* \* \* \*